(12) United States Patent
Herbordt

(10) Patent No.: US 10,641,796 B2
(45) Date of Patent: May 5, 2020

(54) OSCILLOSCOPE AND METHOD FOR OPERATING AN OSCILLOSCOPE

(71) Applicant: Rohde & Schwarz GmbH & Co. KG, Munich (DE)

(72) Inventor: Wolfgang Herbordt, Ottobrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 317 days.

(21) Appl. No.: 15/676,559

(22) Filed: Aug. 14, 2017

(65) Prior Publication Data
US 2019/0049488 A1 Feb. 14, 2019

(51) Int. Cl.
*G01R 13/02* (2006.01)

(52) U.S. Cl.
CPC ............................. *G01R 13/0254* (2013.01)

(58) Field of Classification Search
CPC .... G01R 13/0254; G01R 13/20; G01R 13/34; G01R 1/04; G01R 13/46; G01R 13/02; G01R 13/22
USPC .................................................... 324/121 R
See application file for complete search history.

(56) References Cited

U.S. PATENT DOCUMENTS

| 4,550,387 | A |   | 10/1985 | Takita |  |
|---|---|---|---|---|---|
| 4,855,682 | A | * | 8/1989 | Van Groningen | G01R 13/32 327/199 |
| 7,191,079 | B2 |   | 3/2007 | Smith et al. |  |
| 7,508,239 | B2 |   | 3/2009 | Tran et al. |  |
| 2003/0220753 | A1 | * | 11/2003 | Pickerd | G01R 13/0254 702/67 |
| 2009/0146642 | A1 | * | 6/2009 | Caffrey | G01R 19/2516 324/114 |
| 2012/0078557 | A1 | * | 3/2012 | Dobyns | G01R 13/0236 702/66 |
| 2012/0274313 | A1 | * | 11/2012 | Holcomb | G01R 13/20 324/121 R |
| 2016/0179073 | A1 | * | 6/2016 | Lehane | G01R 13/0254 326/46 |

* cited by examiner

*Primary Examiner* — Melissa J Koval
*Assistant Examiner* — Courtney G McDonnough
(74) *Attorney, Agent, or Firm* — Schwabe, Williamson & Wyatt, P.C.

(57) ABSTRACT

An oscilloscope comprises at least one analog input channel configured to receive and process an analog input signal, at least one digital input channel configured to receive and process a digital input signal, and a trigger unit. Said trigger unit is connected with said at least one analog input channel and said at least one digital input channel. Said trigger unit is configured to detect predetermined trigger events in both said analog input signal and said digital input signal. Said trigger unit further is configured to control data acquisition based on a combination of at least two trigger events detected in said analog input signal and said digital input signal.

17 Claims, 1 Drawing Sheet

OSCILLOSCOPE AND METHOD FOR OPERATING AN OSCILLOSCOPE

FIELD OF THE DISCLOSURE

Embodiments of the present disclosure relate generally to an oscilloscope as well as a method for operating an oscilloscope.

BACKGROUND

Logic analyzers are commonly used for testing and troubleshooting of digital electronic circuits or of computer systems. The logic analyzers typically comprise digital trigger units that are designed to detect complicated trigger events, so that the logic analyzer can depict timing relationships between several signals of a device under test. Logic analyzers, however, are only able to depict timing relationships of digital signals.

Moreover, several separately formed measurement devices, e.g. an oscilloscope and a logic analyzer, are needed for analyzing properties of systems that comprise both analog and digital signals, in particular timing relationships between these signals. Thus, cross-domain measurements are complicated due to additional cabling and expensive as two separate measurement devices are used for performing the dedicated measurements.

Accordingly, there is a need for a possibility to analyze timing relationships between several analog and digital signals of a device under test in an easy and cost-efficient manner.

SUMMARY

Embodiments of the present disclosure provide an oscilloscope. The oscilloscope comprises at least one analog input channel configured to receive and process an analog input signal, at least one digital input channel configured to receive and process a digital input signal, and a trigger unit, said trigger unit being connected with said at least one analog input channel and said at least one digital input channel, said trigger unit being configured to detect predetermined trigger events in both said analog input signal and said digital input signal, said trigger unit further being configured to control data acquisition based on a combination of at least two trigger events detected in said analog input signal and said digital input signal. In particular, the times at which the trigger events in the respective channels occur are taken into account for controlling data acquisition. Therefore, the oscilloscope is capable of analyzing properties of systems that comprise both analog and digital signals. Moreover, the oscilloscope is capable of analyzing timing relationships between several analog and digital signals of a device under test. The oscilloscope therefore combines the several measurement devices needed beforehand into one single measurement device. The predetermined trigger events may be preset or set by a user via a user interface, for instance a graphical user interface displayed on a display screen of the oscilloscope.

According to an aspect of the disclosure, the oscilloscope further comprises at least one signal generator channel allocated to at least one signal generator, said signal generator channel being configured to process a signal received from said trigger unit and to forward a signal generator signal to said trigger unit. The signal generator may be used as an internal clock for internal temporal alignment of the components of the oscilloscope as an output event is generated. The signal generator channel may comprise analog signal generator sub-channels and digital signal generator sub-channels.

According to another aspect of the disclosure, said signal generator is configured to generate a signal generator output signal based on said signal received from said trigger unit. Therefore, the signal generator may generate a suitable signal required for temporally aligning data acquisition of several of the analog and digital input signals. For instance, start generating a signal generator output signal and/or stop generating a signal generator output signal may be triggered by using the trigger unit.

In one embodiment, said trigger unit is configured to detect predetermined trigger events in said signal generator signal. The detected trigger events can be used for temporally aligning data acquisition of several of the analog and digital input signals. Accordingly, the signal generator signal may be forwarded to the trigger unit directly.

In another aspect, said at least one signal generator is at least one of a function generator, a waveform generator, a pattern generator, a frequency generator, and an arbitrary generator. Several signal generators may be provided with a signal generator channel allocated to each of them. Each of the signal generators may be at least one of a function generator, a waveform generator, a pattern generator, a frequency generator, and an arbitrary generator. In particular, the several signal generators may be different from each other, thus providing a high amount of diversity regarding the signal generator signals that can be generated.

In a certain embodiment, said trigger unit is further configured to control data acquisition based on the trigger events detected in said signal generator signal. For example, the trigger unit can use the trigger events detected in said signal generator signal to temporally align data acquisition of the several analog and digital input signals.

According to a further aspect, said trigger unit comprises a state machine trigger member. Thus, more different types of trigger events can be detected.

In one embodiment, said state machine trigger member is integrated in said oscilloscope. Thus only one measurement device is needed, which makes measurement setups more compact and easier to arrange as the cabling is reduced.

In another embodiment, said oscilloscope is configured to perform cross-domain analyses. Therefore, the oscilloscope is capable of analyzing timing relationships between several analog and digital signals of a device under test. In addition, the signal generator signals may be also taken into account for triggering purposes if a signal generator is provided, in particular integrated in the oscilloscope.

According to an aspect of the disclosure, said trigger unit further is configured to detect predetermined trigger events in signals processed by additional components of said oscilloscope. The additional components may be at least one of a memory, a memory controller, a signal post-processing unit, a second trigger unit, a control unit, a display unit, and a display memory. Therefore, many different sources may be taken into account. The additional components may be integrated. Alternatively or supplementarily, the oscilloscope may have at least one interface for the additional component(s).

According to a further aspect, said trigger unit is configured to control data acquisition based on trigger events detected in signals processed by said additional components. Therefore, additional trigger conditions can be set. This enables fine adjustments of trigger conditions and thereby a detailed study of signals from a device under test. Further, the overall diversity of the oscilloscope is increased.

In a certain embodiment, said oscilloscope is configured to perform two-stage triggering. This way, even more trigger conditions can be set, in particular by a user via a user interface, thereby allowing even more accurate studies of signals from a device under test. Triggering by the trigger unit may be combined with a post-processing trigger unit. The post-processing trigger unit may be a second trigger unit or a software trigger unit, for example a zone trigger or a mask trigger. The first trigger stage, however, may be a hardware trigger.

In another aspect, said trigger unit is configured to perform sequential triggering. In particular, the trigger unit is configured to perform cross-domain sequential triggering, i.e. an analysis of timing relationships of analog and digital input signals. This way, the oscilloscope is capable of analyzing the response of a digital system to an analog input signal and vice versa. Sequential triggering can be used for analyzing spectra of signals, in particular timing relationships between spectra of analog and digital signals, using the spectrum analysis capabilities of the oscilloscope. The sequential triggering may be used as the first stage of a two-stage triggering.

Embodiments of the present disclosure also provide a method for operating an oscilloscope. The method comprises the following steps:

receiving and processing an analog input signal;
receiving and processing a digital input signal;
detecting at least one predetermined trigger event in each of said analog input signal and digital input signal; and
controlling data acquisition based on a combination of the trigger events detected. In particular, the times at which the trigger events in the respective channels occur are taken into account for controlling data acquisition. Therefore, properties of systems that comprise both analog and digital signals are analyzed. Moreover, the timing relationships between several analog and digital signals of a device under test are analyzed. The predetermined trigger events may be preset, for instance by a manufacturer, or set by a user of the oscilloscope.

In a certain embodiment, the method further comprises the following steps:

generating a trigger signal;
processing said trigger signal; and
generating a signal generator signal. The signal generator signal may be used as an internal clock for internal temporal alignment of the components of the oscilloscope. Therefore, the signal generator signal generated is such that it is suitable for temporally aligning data acquisition of several of the analog and digital input signals.

According to an aspect of the disclosure, the signal generator signal is generated based on said trigger signal. Therefore, the signal generator signal can be matched to the needs of the trigger unit for temporally aligning data acquisition of the several analog and digital input signals.

In another aspect, the method further comprises the following steps:

detecting a predetermined trigger event in said signal generator signal; and
controlling data acquisition based on said trigger event detected in said signal generator signal. For example, the trigger events detected in said signal generator signal can be used to temporally align data acquisition of the several analog and digital input signals.

In a certain embodiment, data acquisition is controlled based on a combination of the trigger events detected in the analog input signal, the digital input signal and the signal generator signal. In particular, the times at which the trigger events in the respective channels occur are taken into account for controlling data acquisition. The trigger events detected in said signal generator signal can be used to temporally align data acquisition of the analog and digital input signals. Thus, timing relationships between several analog and digital signals of a device under test can be analyzed.

According to an aspect of the disclosure, the method further comprises the following steps:

detecting a predetermined trigger event in signals processed by components of said oscilloscope other than said analog input channel, said digital input channel and said signal generator channel; and
controlling data acquisition based on trigger events detected in signals processed by said additional components. Therefore, additional trigger conditions can be set. This enables fine adjustments of trigger conditions and thereby a detailed study of signals from a device under test.

At least one of a two-stage triggering and a sequential triggering may be performed. In particular, both two-stage triggering and sequential triggering may be performed in a certain scenario in a combined manner. The sequential triggering may be performed first and post-processing triggering, for example in the form of zone triggering, may be performed afterwards as a second stage. This way, more trigger conditions can be set, thereby enabling an even more detailed study of signals from a device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
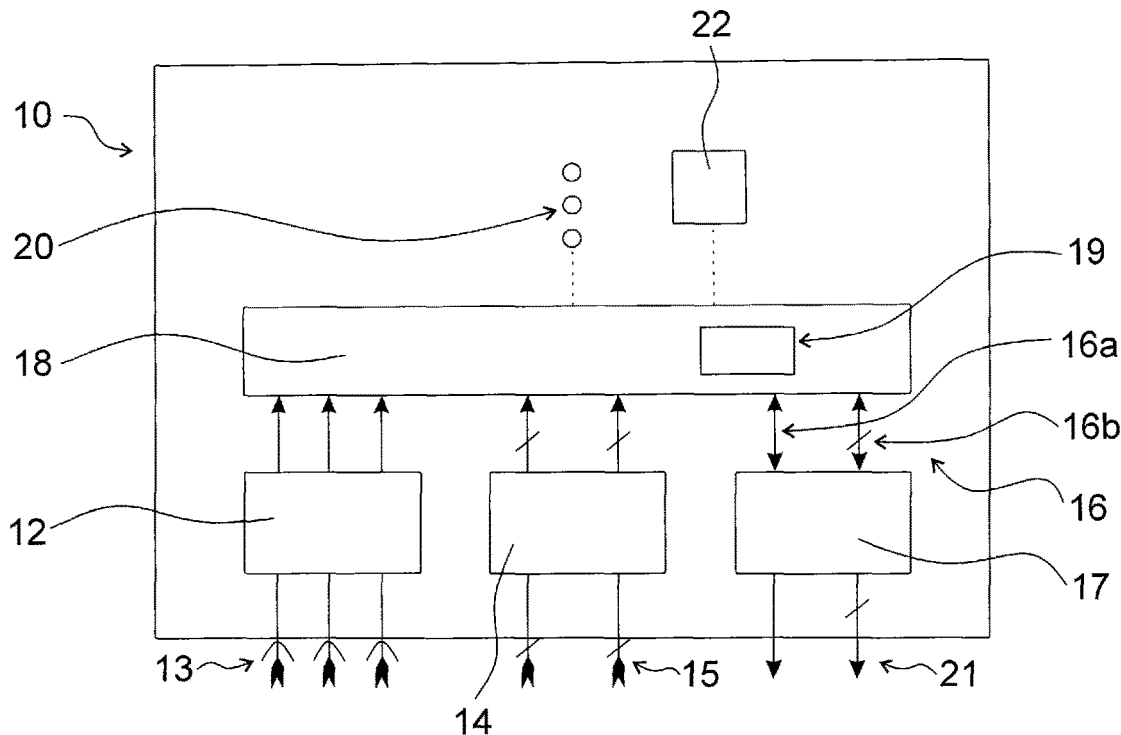
FIG. 1 shows a schematic overview of one representative embodiment of an oscilloscope according to the disclosure.

In FIG. 1, an oscilloscope 10 is shown. The oscilloscope 10 comprises several analog input channels 12 allocated to corresponding analog inputs 13 and several digital input channels 14 allocated to corresponding digital inputs 15.

The oscilloscope 10 further comprises a signal generator channel 16 allocated to a signal generator 17, for instance an analog one. In the shown embodiment, the signal generator channel 16 comprises an analog sub-channel 16a and a digital signal generator sub-channel 16b.

Said signal generator 17 may be one of a function generator, a waveform generator, a pattern generator, a frequency generator and an arbitrary generator.

The analog input channels 12 and the digital input channels 14 are each configured to receive and process an analog input signal and a digital input signal fed via the dedicated inputs 13, 15, respectively.

A trigger unit 18 is provided within the oscilloscope 10 wherein the trigger unit 18 is connected in a signal transmitting manner to all of the analog input channels 12, the digital input channels 14 and the signal generator channel 16. More precisely, the trigger unit 18 is connected to both the analog and digital signal generator sub-channels 16a, 16b of the signal generator channel 16 in a signal transmitting manner. The trigger unit 18 may comprise a state-machine trigger member 19, which is integrated in the oscilloscope 10.

The signal generator 17 is configured to receive and process a signal received from the trigger unit 18. Said signal generator 17 is furthermore configured to generate a signal generator signal based on the signal received from the trigger unit 18 and to forward a signal generator signal to the trigger unit 18 that is processed by the trigger unit 18 appropriately as will be described with respect to FIG. 2.

There may be provided additional components 20 in the oscilloscope 10, which are represented by the dots shown in FIG. 1. The additional components 20 may be at least one of a memory, a memory controller, a signal post-processing unit, a second trigger unit, a control unit, a display unit and a display memory. Thus, the additional components 20 may be integrated into the oscilloscope 10. Alternatively, the oscilloscope 10 may have at least one interface for separately formed additional component(s) 20 to be connected to the oscilloscope 10 via the appropriate interface.

The trigger unit 18 is configured to receive signals from the analog input channels 12 and the digital input channels 14. The trigger unit 18 is further configured to detect predetermined trigger events in both the analog input signal and the digital input signal, wherein the trigger events detected in the analog and the digital input signals may be different from each other. The trigger unit 18 may also be configured to detect predetermined trigger events in signals from the signal generator 17 and the additional components 20. In general, several (different) signal generators 17 may be provided that each forwards a signal generator signal to the trigger unit 18.

Moreover, the signal generator 17 is configured to output a signal generator output signal that may be outputted via an output 21 allocated to the signal generator 17. For instance, start generating a signal generator output signal and/or stop generating a signal generator output signal may be triggered by using the trigger unit 18.

Figure 2:
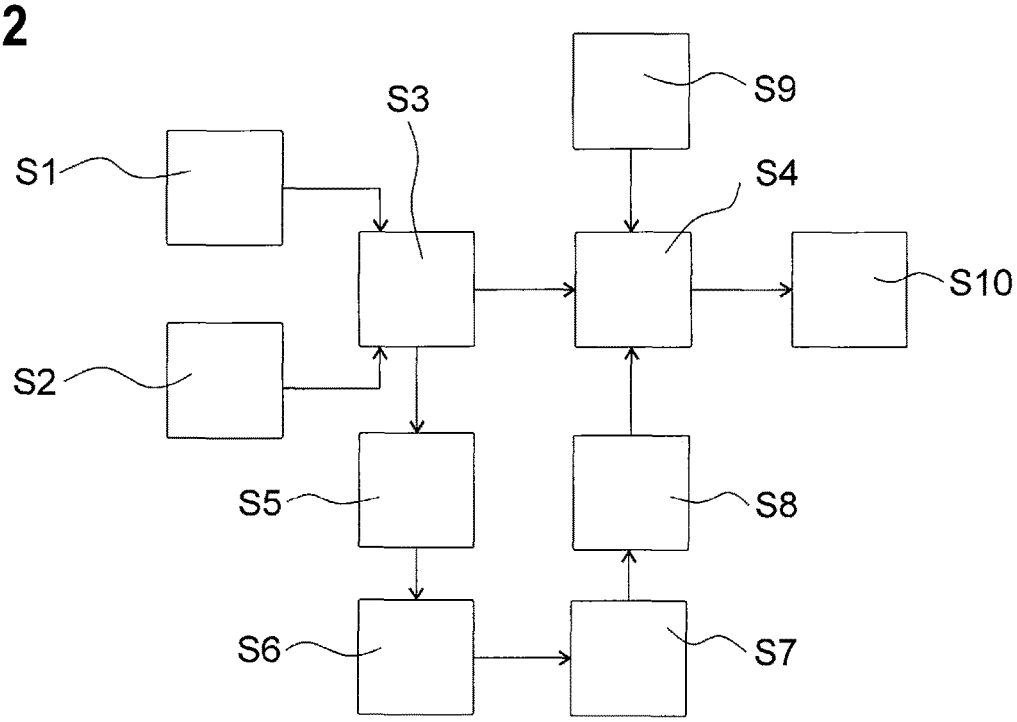
FIG. 2 shows a schematic flow chart of one embodiment of a method according to the disclosure.

A method for operating the oscilloscope 10 is illustrated in FIG. 2.

First, analog input signals and digital input signals are received and processed by the analog input channels 12 and the digital input channels 14, respectively (steps S1 and S2).

Then, at least one predetermined trigger event is detected in each of an analog input signal and a digital input signal (step S3). Based on a combination of the trigger events detected, data acquisition is controlled by the trigger unit 18 (step S4). In particular, the times at which the trigger events in the respective channels occur are taken into account for controlling data acquisition.

For example, the trigger unit 18 may detect a first predetermined trigger event in one of the analog input channels 12, which sets the trigger unit 18. If a second predetermined trigger event is detected in one of the digital input channels 14, data acquisition is started by the trigger unit 18. In other words, the trigger unit 18 is configured to perform cross-domain sequential triggering. Of course, it is to be understood that the example above merely is given for purposes of illustration. A sequence of trigger events needed to prime the trigger unit 18 and to start data acquisition may be much more complicated. The predetermined trigger events may preset, for instance by a manufacturer, or set by a user via a user interface provided at a display screen of the oscilloscope 10.

Operated as described above, the oscilloscope 10 can be used as logic analyzer, as it is capable of detecting sequential trigger events across analog and digital channels 12, 14.

Moreover, the oscilloscope 10 is capable of analyzing cross-domain timing relationships between several analog and digital input signals. The detected events can be depicted on the display screen or be stored in a memory of the oscilloscope 10 at least temporarily.

The trigger unit 18 may generate a trigger signal and forward it to the signal generator 17 (step S5). Said trigger signal is then processed by the signal generator 17 (step S6). A signal generator signal is generated by the signal generator based on the trigger signal (step S7) and forwarded to the trigger unit 18 directly via the analog signal generator sub-channel 16a or the digital signal generator sub-channel 16b. Alternatively or supplementarily, a signal generator output signal is outputted via one of the outputs 21, in particular the analog or the digital one.

The trigger unit 18 then may detect predetermined trigger events in the signal generator signal (step S8) and control data acquisition based on the trigger events detected. In particular, the trigger unit 18 controls data acquisition based on a combination of trigger events detected in each of an analog input signal, a digital input signal and said signal generator signal, wherein the times of the individual trigger events may be taken into account as described above. The signal generator signal may be used by the trigger unit 18 as an internal clock for internal temporal alignment.

The trigger unit 18 further may detect predetermined trigger events in signals processed by the additional components 20 of the oscilloscope 10 and may control data acquisition based on the trigger events detected in the signals processed by said additional components 20. In particular, the trigger unit 18 may control data acquisition based on a combination of trigger events detected in each of an analog input signal, a digital input signal, said signal generator signal, said signal generator output signal (if refed) and said signals processed by the additional components 20, wherein the times of the individual trigger events may be taken into account as described above.

Based on the combination of trigger events detected, the trigger unit 18 may generate a second trigger signal and forward it to a post-processing trigger unit 22 (step S10). The post-processing trigger unit 22 may be a software-implemented trigger, for example a zone trigger or a mask trigger. The post-processing trigger unit 22 may process said second trigger signal in view of at least one predetermined post-processing trigger condition and may control data acquisition based on whether said at least one predetermined post-processing trigger condition is met by the second trigger signal.

In other words, in this embodiment of the disclosure, sequential triggering by the trigger unit 18 is combined with two-stage triggering.

The invention claimed is:

1. An oscilloscope, comprising:
   at least one analog input channel configured to receive and process an analog input signal,
   at least one digital input channel configured to receive and process a digital input signal, and
   a trigger unit,
   said trigger unit being connected with said at least one analog input channel and said at least one digital input channel,
   said trigger unit being configured to detect predetermined trigger events in both said analog input signal and said digital input signal, said trigger unit further being configured to control data acquisition based on a combination of at least two trigger events detected in said analog input signal and said digital input signal, said oscilloscope further comprising at least one signal generator channel allocated to at least one signal generator, said signal generator channel being configured to process a signal received from said trigger unit and to forward a signal generator signal to said trigger unit wherein the signal generator is configured to generate a signal generator output signal based on said signal received from said trigger unit, and wherein the signal generator signal is used for temporarily aligning data acquisition of several of the analog and digital input signals.

2. The electrical measurement device according to claim 1, wherein said trigger unit is configured to detect predetermined trigger events in said signal generator signal.

3. The electrical measurement device according to claim 1, wherein said at least one signal generator is at least one of a function generator, a waveform generator, a pattern generator, a frequency generator, and an arbitrary generator.

4. The electrical measurement device according to claim 1, wherein said trigger unit is further configured to control data acquisition based on the trigger events detected in said signal generator signal.

5. The oscilloscope according to claim 1, wherein said trigger unit comprises a state machine trigger member.

6. The oscilloscope according to claim 5, wherein said state machine trigger member is integrated in said oscilloscope.

7. The oscilloscope according to claim 1, wherein said oscilloscope is configured to perform cross-domain analyses.

8. The oscilloscope according to claim 1, wherein said trigger unit further is configured to detect predetermined trigger events in signals processed by additional components of said oscilloscope.

9. The oscilloscope according to claim 8, wherein said trigger unit is configured to control data acquisition based on trigger events detected in signals processed by said additional components.

10. The oscilloscope according to claim 1, wherein said oscilloscope is configured to perform two-stage triggering.

11. The oscilloscope according to claim 1, wherein said trigger unit is configured to perform sequential triggering.

12. A method for operating an oscilloscope, comprising the steps of:
Receiving and processing an analog input signal;
Receiving and processing a digital input signal;
Detecting at least one predetermined trigger event in each of said analog input signal and digital input signal; and
Controlling data acquisition based on a combination of the trigger events detected
Generating a trigger signal;
Processing said trigger signal; and
Generating a signal generator signal,
wherein said signal generator signal is generated based on signal trigger signal, and wherein the signal generator signal is used for temporarily aligning data acquisition of several of the analog and digital input signals.

13. The method according to claim 12, further comprising the steps of:
Detecting a predetermined trigger event in said signal generator signal; and
Controlling data acquisition based on said trigger event detected in said signal generator signal.

14. The method according to claim 13, wherein data acquisition is controlled based on a combination of the trigger events detected in the analog input signal, the digital input signal and the signal generator signal.

15. The method according to claim 12, further comprising the steps of:
Detecting a predetermined trigger event in signals processed by components of said oscilloscope other than said analog input channel, said digital input channel and said signal generator channel; and
Controlling data acquisition based on trigger events detected in signals processed by said additional components.

16. The method according to claim 12, wherein at least one of a two-stage triggering and a sequential triggering is performed.

17. An oscilloscope, comprising:
at least one analog input channel configured to receive and process an analog input signal,
at least one digital input channel configured to receive and process a digital input signal, and
a trigger unit,
said trigger unit being connected with said at least one analog input channel and said at least one digital input channel,
said trigger unit being configured to detect predetermined trigger events in both said analog input signal and said digital input signal,
said trigger unit further being configured to control data acquisition based on a combination of at least two trigger events detected in said analog input signal and said digital input signal,
said oscilloscope further comprising at least one signal generator channel allocated to at least one signal generator, said signal generator channel being configured to process a signal received from said trigger unit and to forward a signal generator signal to said trigger unit, and
wherein the signal generator is used as an internal clock for internal temporal alignment of components of the oscilloscope.

* * * * *